(12) United States Patent
Wada et al.

(10) Patent No.: US 12,095,214 B2
(45) Date of Patent: Sep. 17, 2024

(54) CONNECTOR AND TERMINAL FITTING

(71) Applicant: Yazaki Corporation, Tokyo (JP)

(72) Inventors: Kotarou Wada, Shizuoka (JP); Naoki Takamura, Shizuoka (JP); Naokazu Nagasaka, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 468 days.

(21) Appl. No.: 17/643,288

(22) Filed: Dec. 8, 2021

(65) Prior Publication Data

US 2022/0190537 A1 Jun. 16, 2022

(30) Foreign Application Priority Data

Dec. 11, 2020 (JP) ................................. 2020-205433
Sep. 15, 2021 (JP) ................................. 2021-150057

(51) Int. Cl.
*H01R 43/02* (2006.01)
*H01R 12/70* (2011.01)
*H01R 12/71* (2011.01)
*H01R 12/77* (2011.01)

(52) U.S. Cl.
CPC ....... *H01R 43/0221* (2013.01); *H01R 12/707* (2013.01); *H01R 12/716* (2013.01); *H01R 12/77* (2013.01); *H01R 43/0256* (2013.01)

(58) Field of Classification Search
CPC ............ H01R 43/0221; H01R 43/0256; H01R 12/707; H01R 12/77; H01R 12/716; H01R 43/02
See application file for complete search history.

(56) References Cited

U.S. PATENT DOCUMENTS

| | | | | |
|---|---|---|---|---|
| 3,096,393 A | * | 7/1963 | Mancini ................. | H01R 12/58 439/83 |
| 3,621,445 A | * | 11/1971 | Horecky ................ | H01R 12/58 439/853 |
| 3,953,103 A | * | 4/1976 | Mathis ................... | H01R 4/185 439/82 |
| 3,995,931 A | * | 12/1976 | Pienkowski ........... | H01R 12/58 439/876 |

(Continued)

FOREIGN PATENT DOCUMENTS

| | | |
|---|---|---|
| GB | 2 340 675 A | 2/2000 |
| JP | 2001-043914 A | 2/2001 |

(Continued)

*Primary Examiner* — Harshad C Patel
(74) *Attorney, Agent, or Firm* — Sughrue Mion, PLLC

(57) ABSTRACT

A connector includes: a terminal fitting having a terminal part and a conductor connecting part; a housing in which the terminal fitting is housed; and a conductive component that is molded as a laminate body including an electrical conductor and an electrical insulator and having a through-hole, and causes the electrical conductor to be physically and electrically connected to the conductor connecting part inserted into the through-hole when the electrical conductor is soldered to the conductor connecting part. The conductor connecting part is formed in a tubular part with two ends butted each other in a contact state so that end faces that are the non-plated surfaces of the two ends do not appear on the surface, and the entire outer wall surface of the tubular part is a plating layer.

16 Claims, 9 Drawing Sheets

(56) References Cited

U.S. PATENT DOCUMENTS

| | | | | |
|---|---|---|---|---|
| 5,147,227 | A * | 9/1992 | Yurko | H01R 13/41 439/82 |
| 5,772,454 | A * | 6/1998 | Long, Jr. | H01R 4/028 439/865 |
| 6,375,521 | B2 * | 4/2002 | Tachi | H01R 43/16 439/877 |
| 6,551,115 | B1 * | 4/2003 | Li | H01R 13/7033 439/947 |
| 6,565,367 | B2 * | 5/2003 | Budman | H01R 12/585 439/82 |
| 7,008,274 | B2 * | 3/2006 | Hayashi | H01R 4/185 439/877 |
| 7,160,122 | B2 * | 1/2007 | Larsen | H01R 13/04 439/82 |
| 7,661,997 | B2 * | 2/2010 | Wurster | H01R 43/16 439/751 |
| 2014/0024232 | A1 | 1/2014 | Wehrle et al. | |
| 2017/0162961 | A1 | 6/2017 | Kang et al. | |

FOREIGN PATENT DOCUMENTS

| | | |
|---|---|---|
| JP | 2004-200154 A | 7/2004 |
| JP | 2006-202558 A | 8/2006 |
| JP | 2010-61849 A | 3/2010 |
| JP | 2014-22368 A | 2/2014 |
| JP | 2017-103171 A | 6/2017 |

* cited by examiner

CONNECTOR AND TERMINAL FITTING

CROSS-REFERENCE TO RELATED APPLICATION(S)

The present application claims priority to and incorporates by reference the entire contents of Japanese Patent Application No. 2020-205433 filed in Japan on Dec. 11, 2020 and Japanese Patent Application No. 2021-150057 filed in Japan on Sep. 15, 2021.

BACKGROUND OF THE INVENTION

1. Field of the Invention

The present invention relates to a connector and a terminal fitting.

2. Description of the Related Art

Conventionally, a connector including terminal fittings, a housing in which the terminal fittings are housed, and a conductive component {flexible printed circuit board (what is called FPC), a printed circuit board (what is called PCB), etc.} that physically and electrically connects electrical conductors to the terminal fittings has been known. In such a connector that has been known, conductor connecting parts of the terminal fittings are inserted into through-holes of the conductive component, and the conductor connecting parts are physically and electrically connected to the electrical conductors of the conductive component when the conductor connecting parts are soldered to the electrical conductors of the conductive component. In the terminal fittings, at least the conductor connecting parts are plated in order to improve solder wettability. This type of connector is disclosed in, for example, Japanese Patent Application Laid-open No. 2001-43914 and Japanese Patent Application Laid-open No. 2017-103171. By the way, there are terminal fittings formed by preparing a metal plate as a base material that has been plated beforehand, and then performing press molding involving cutting, bending, and the like on the metal plate. In such a terminal fitting, a sheared surface caused by cutting appears on the surface as a non-plated area, and therefore, when soldering to the conductive component is performed, the non-plated area of the conductor connecting part may cause solder balls (solder spatter).

SUMMARY OF THE INVENTION

An object of the present invention is to provide a connector and a terminal fitting that can suppress the generation of solder balls.

In order to achieve the above mentioned object, a connector according to one aspect of the present invention includes a terminal fitting having a terminal part and a conductor connecting part; a housing in which the terminal fitting is housed; and a conductive component that is molded as a laminate body including an electrical conductor and an electrical insulator and having a through-hole, and causes the electrical conductor to be physically and electrically connected to the conductor connecting part inserted into the through-hole when the electrical conductor is soldered to the conductor connecting part, wherein the conductor connecting part is formed in a tubular part with two ends butted each other in a contact state so that end faces that are non-plated surfaces of the ends do not appear on a surface, and an entire outer wall surface of the tubular part is a plating layer.

In order to achieve the above mentioned object, a terminal fitting according to another aspect of the present invention includes a terminal part; a conductor connecting part that is inserted into a through-hole of a conductive component molded as a laminate body including an electrical conductor and an electrical insulator and is physically and electrically connected the electrical conductor when the electrical conductor is soldered to the conductor connecting part, wherein the conductor connecting part is formed in a tubular part with two ends butted each other in a contact state so that end faces that are non-plated surfaces of the ends do not appear on a surface, and an entire outer wall surface of the tubular part is a plating layer.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

The following is a detailed description of an embodiment of a connector and a terminal fitting according to the present invention based on the drawings. Note that the invention is not limited by this embodiment.

Embodiment

An embodiment of the connector and the terminal fitting according to the present invention is described based on FIGS. 1 to 13.

Figure 1:
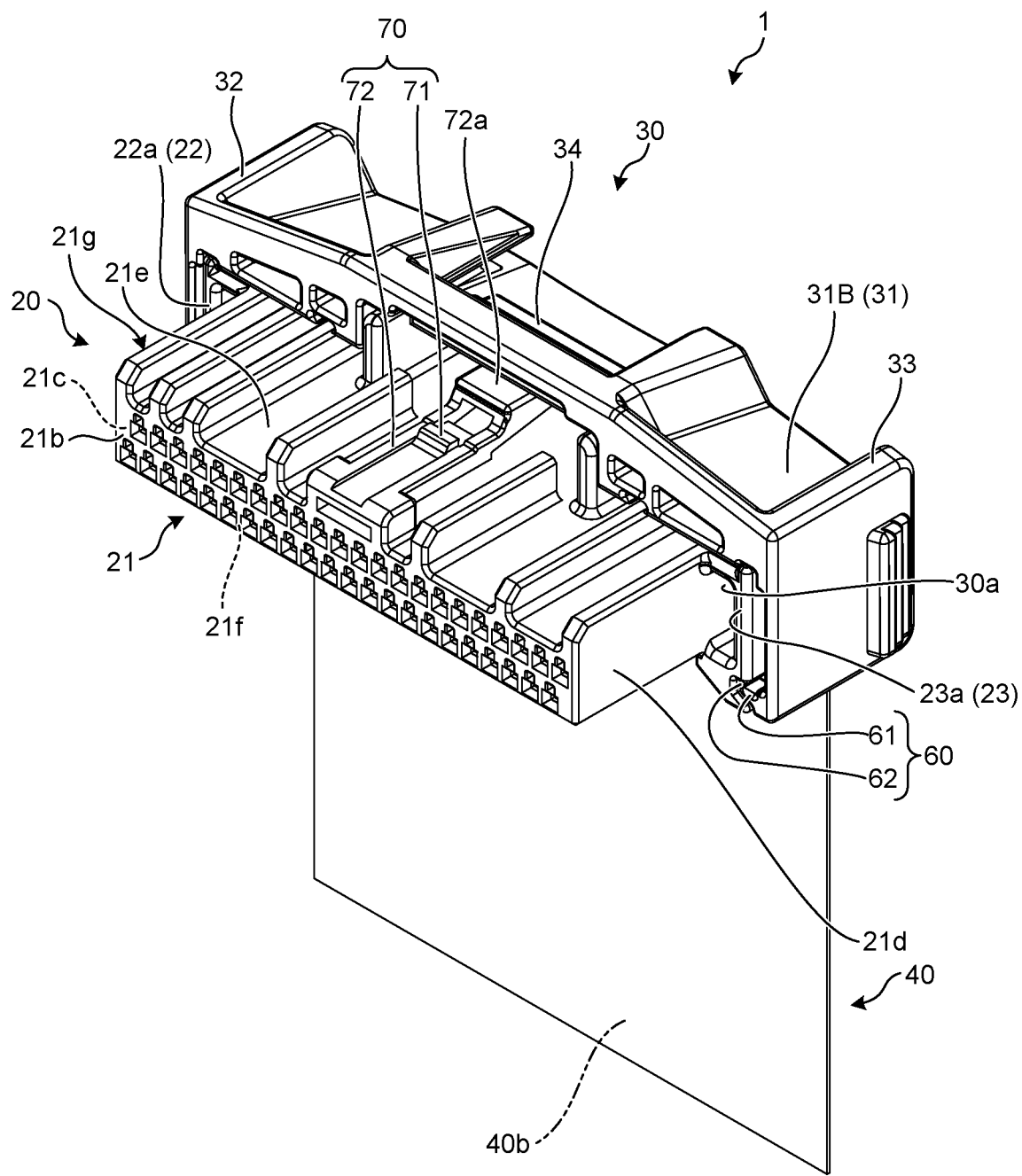
FIG. 1 is a perspective view illustrating a connector of an embodiment.
Figure 2:
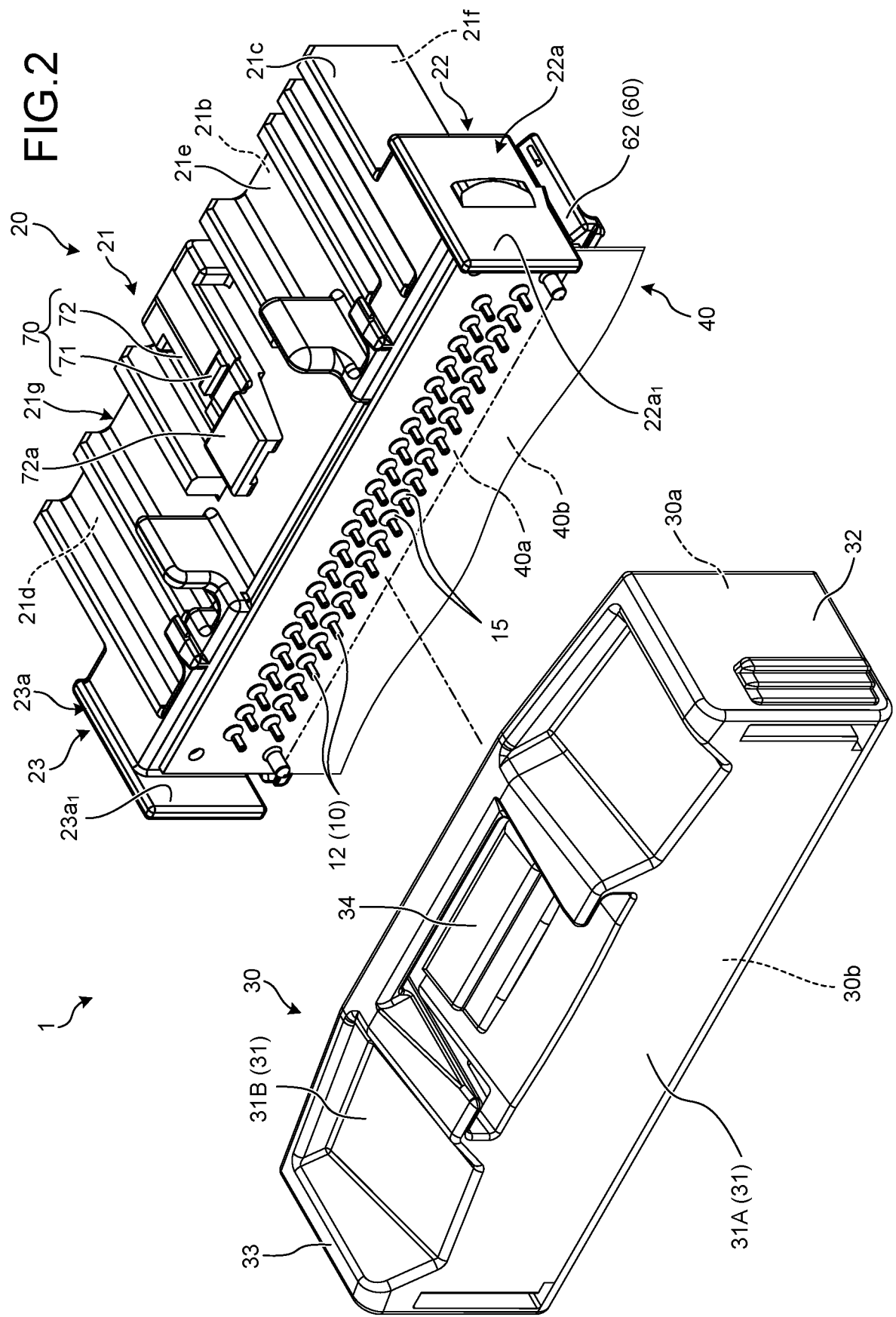
FIG. 2 is an exploded perspective view illustrating the connector before coupled with a cover.
Figure 3:
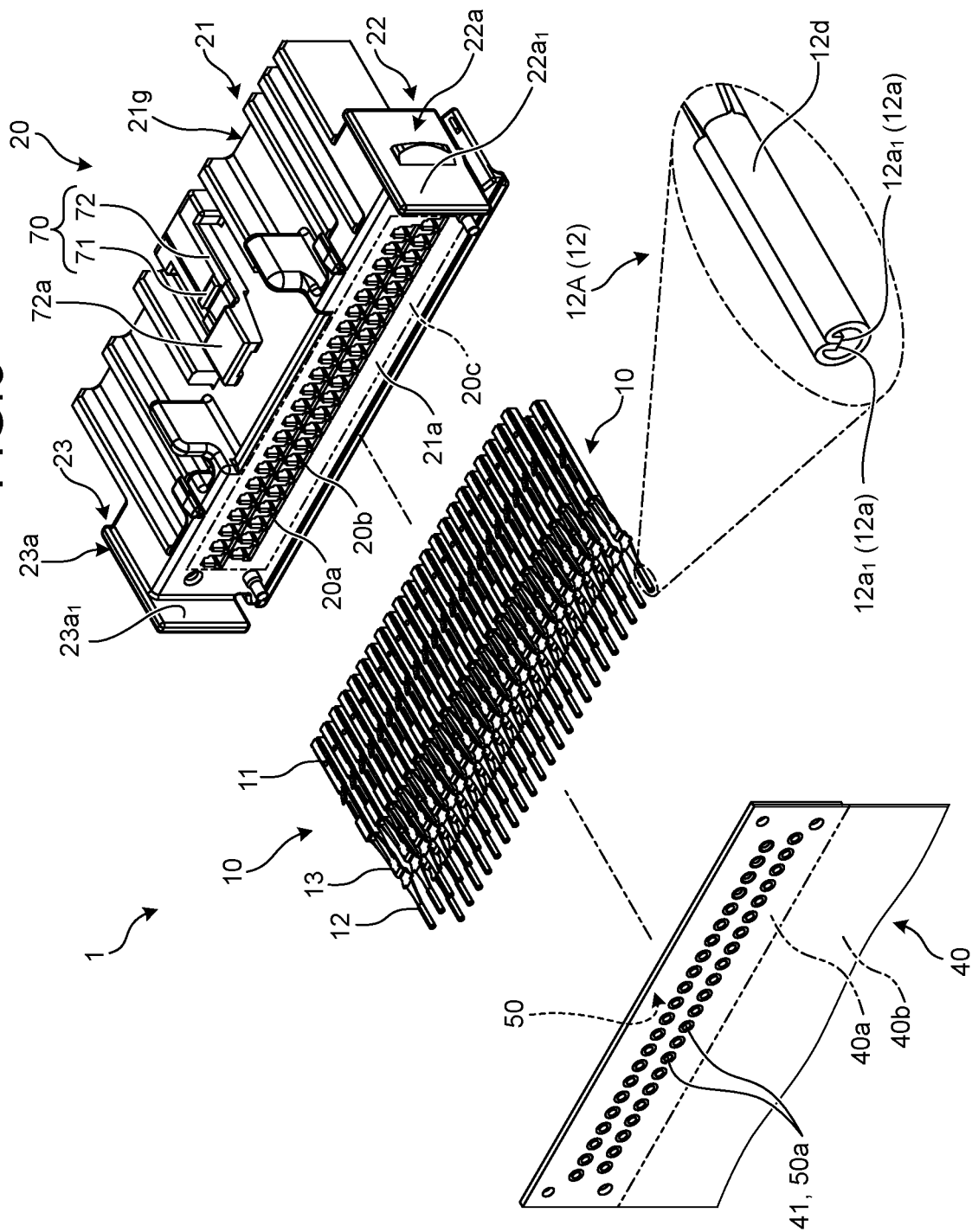
FIG. 3 is an exploded perspective view illustrating the connector (excluding the cover) of the embodiment.

A reference sign 1 in FIGS. 1 to 3 indicates the connector of the present embodiment. The connector 1 has terminal fittings 10, a housing 20 in which the terminal fittings 10 are housed, a cover 30 that is assembled to the housing 20, and a conductive component 40 that is physically and electrically connected to the terminal fittings 10 in the inner space formed by the housing 20 and the cover 30 in an assembly complete state.

Each of the terminal fittings 10 is molded from a conductive material such as a metal. The terminal fitting 10 is molded in a predetermined shape by preparing a metal plate as a base material each plane of which has been plated with tin plating or the like beforehand, and then performing press molding involving cutting, bending, and the like on the metal plate. The terminal fitting 10 has a terminal part 11 to be physically and electrically connected to a counterpart terminal fitting of a counterpart connector (not illustrated), and a conductor connecting part 12 to be physically and electrically connected to the conductive component 40 (FIG. 3). The terminal fitting 10 has a coupling part 13 that couples the terminal part 11 to the conductor connecting part 12 (FIG. 3). The counterpart connector may be, for example, a connector that is electrically connected to a counterpart electrical equipment (inverter, etc.), or may be a connector part included in a terminal block provided to the counterpart electrical equipment.

The terminal part 11 is formed in the shape of, for example, a female or male terminal. The terminal part 11 described here is formed in a shape of a female terminal having a square tubular box, and insertion and removal along a tube axis direction is performed between the terminal part 11 and the counterpart terminal fitting.

The conductor connecting part 12 is formed in a tubular shape. This conductor connecting part 12 is obtained by bending a flat plate part 12X (FIG. 4) to a tubular shape, the flat plate part 12X having been cut out from a metal plate by the cutting process during press molding. For example, in the conductor connecting part 12 described here, the flat plate part 12X is cut out to a rectangular shape by the cutting process, and this flat plate part 12X is bent into a tubular shape by the bending process. In this flat plate part 12X, end faces $12a_1$ and $12a_1$ of two ends (edges in this example) $12a$ and $12a$ are wall surfaces along the same direction as a tube axis of the conductor connecting part 12. This flat plate part 12X has the two ends $12a$ and $12a$ and a base $12b$ between the two ends $12a$ and $12a$, and these parts are bent to form the conductor connecting part 12 with a tubular shape. The end faces $12a_1$ and $12a_1$ in the first two ends $12a$ and $12a$ are wall surfaces along the same direction as the tube axis of the conductor connecting part 12 even after formed as the conductor connecting part 12 (FIG. 3).

Figure 4:
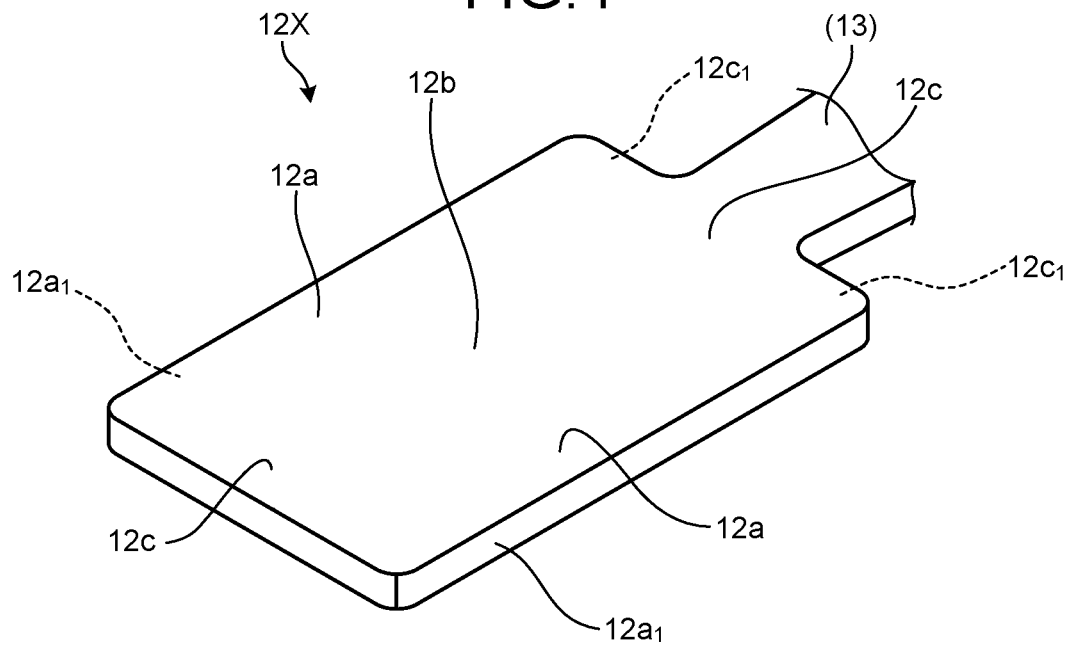
FIG. 4 is a perspective view illustrating an unfolded shape of a conductor connecting part before a bending process.

Here, in this flat plate part 12X, end faces $12c_1$ and $12c_1$ of second two ends (edges in this example) $12c$ and $12c$ different from the two ends $12a$ and $12a$ are wall surfaces orthogonal to the tube axis direction of the conductor connecting part 12 (FIG. 4). The end faces $12c_1$ and $12c_1$ are wall surfaces orthogonal to the tube axis direction of the conductor connecting part 12 even after formed as the conductor connecting part 12. Note that the center of one of the end faces $12c_1$ and $12c_1$ is joined to the coupling part 13.

This conductor connecting part 12 is to be soldered to an electrical conductor of the conductive component 40 described later in a through-hole 41 of the conductive component 40 described later. This conductor connecting part 12 has a plating layer at a place corresponding to each plane of the flat plate part 12X, and this plating layer improves the wettability of the solder when soldering.

On the other hand, the flat plate part 12X has a sheared surface formed by the cutting process during press molding, and this sheared surface is a non-plated surface without a plating layer. In this flat plate part 12X, the end faces $12a_1$, $12a_1$, $12c_1$, and $12c_1$ of the ends (edges in this example) $12a$, $12a$, $12c$, and $12c$ are sheared surfaces (non-plated surfaces). Therefore, in the conductor connecting part 12, the end faces $12a_1$, $12a_1$, $12c_1$, and $12c_1$ of the ends (edges in this example) $12a$, $12a$, $12c$, and $12c$ remain as sheared surfaces (non-plated surfaces). In addition, the sheared surfaces (non-plated surfaces) may have burrs caused by the cutting process.

Therefore, in order to reduce the decrease in solder wettability due to the sheared surfaces (non-plated surfaces), the conductor connecting part 12 is formed in a tubular part (FIG. 3 and FIGS. 5 to 7) with the two ends $12a$ and $12a$ butted each other in a contact state so that the end faces $12a_1$ and $12a_1$ that are the non-plated surfaces of the first two ends $12a$ and $12a$ do not appear on the surface. The conductor connecting part 12 is formed so that the entire outer wall surface $12d$ of the tubular part is a plating layer. In the conductor connecting part 12 described here, since the plating process has already been applied to each plane of the metal plate at the base material stage, the entire outer wall surface $12d$ becomes a plating layer by simply forming the conductor connecting part 12 in a tubular shape as described above.

This conductor connecting part 12 has the entire outer wall surface $12d$ with the plating layer without exposing the end faces $12a_1$ and $12a_1$ as the non-plated surfaces of the respective ends $12a$ and $12a$ to the surface, and can therefore form a suitable solder part 15 between the conductor connecting part 12 and the electrical conductor of the conductive component 40 (FIG. 2). For example, this conductor connecting part 12 does not expose the end faces $12a_1$ and $12a_1$ to the surface on the outer wall surface $12d$ side, and therefore the solder supplied during soldering to the electrical conductor of the conductive component 40 is hard to reach the end faces $12a_1$ and $12a_1$, so that the generation of solder balls (solder spatter) can be prevented. In addition, this conductor connecting part 12 has high solder wettability because the entire outer wall surface $12d$ is the plating layer, and can therefore form the suitable solder part 15 between the conductor connecting part 12 and the electrical conductor of the conductive component 40. The connector 1 described here has the solder part 15 in which the conductor connecting part 12 is laser-soldered to the electrical conductor of the conductive component 40.

Furthermore, this conductor connecting part 12 can deter the generation of solder balls, so that a shortage of insulation distance when another terminal fitting 10 or conductive member is present nearby can be prevented, and a degree of freedom in the direction of solder supply when performing laser soldering can be increased.

Figure 8:
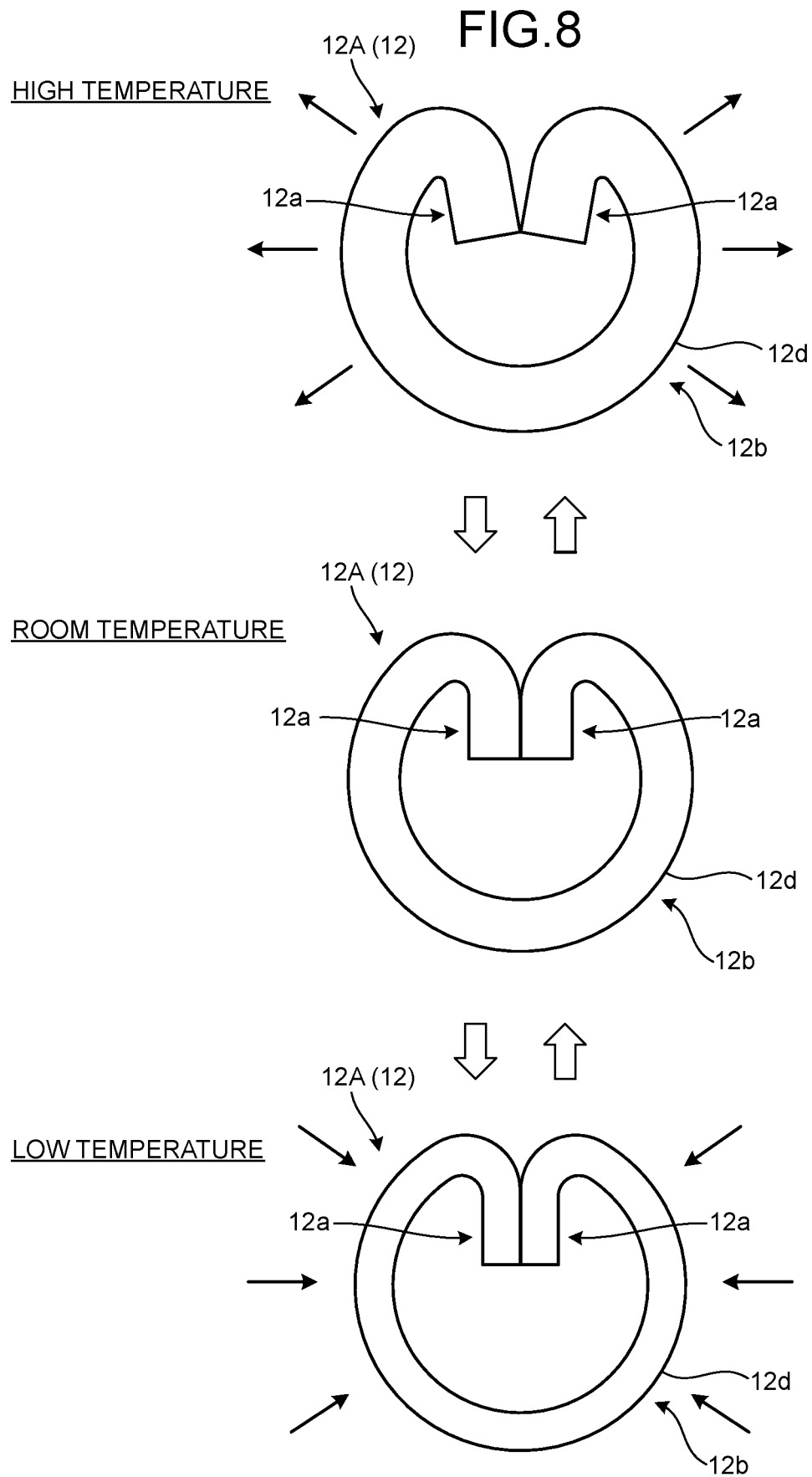
FIG. 8 is a view illustrating thermal effects on the conductor connecting part.
Figure 9:
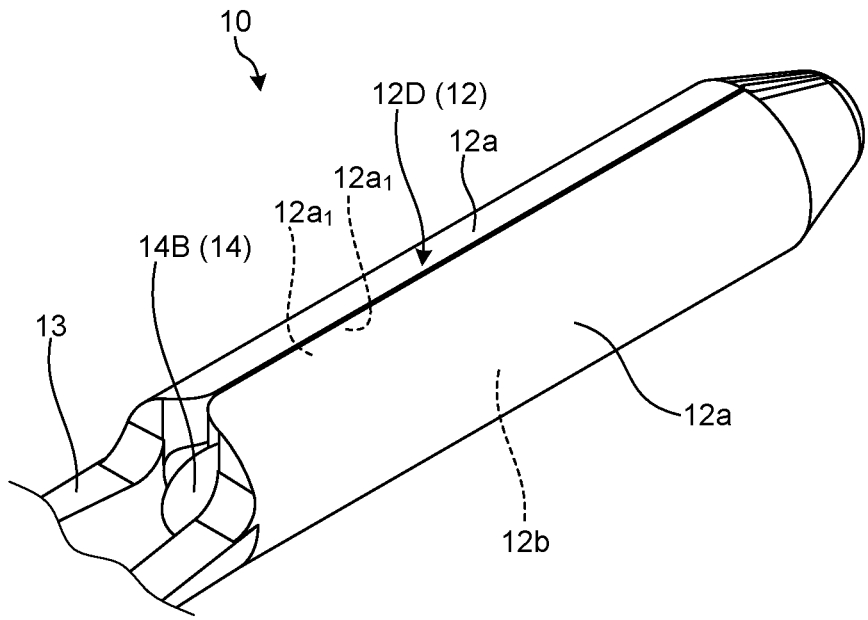
FIG. 9 is a perspective view illustrating a conductor connecting part of a modified embodiment.

In addition, with this conductor connecting part 12, the ends $12a$ and $12a$ are butted each other in the contact state, so that the change in shape when thermal expansion or contraction due to thermal shock occurs can be restricted to a small degree compared to a conductor connecting part with a large gap between the ends $12a$ and $12a$. Therefore, this conductor connecting part 12 can suppress the occurrence of cracks in the solder part 15 when thermal expansion or contraction occurs. FIG. 8 takes a conductor connecting part 12A described later as an example and illustrates the conductor connecting part 12A at room temperature, the conductor connecting part 12A that has been thermally expanded due to high temperature, and the conductor connecting part 12A that has been thermally contracted due to low temperature. Note that, in FIG. 8, the shape change is magnified for convenience of explanation.

Furthermore, with this conductor connecting part 12, even if a minute gap is created between the ends 12a and 12a, the change in shape when thermal expansion or contraction occurs can be restricted to a small degree. In addition, even if such a gap is present, this conductor connecting part 12 can allow the solder to enter the tube through the gap and retain the solder in the tube when soldering to the electrical conductor of the conductive component 40 is performed. Therefore, even if a minute gap has been created between the ends 12a and 12a, this conductor connecting part 12 can secure the fixing strength between the conductor connecting part 12 and the electrical conductor of the conductive component 40, so that the suitable solder part 15 can be formed therebetween. In addition, this conductor connecting part 12 can minimize the amount of solder supply by retaining the solder in this tube without discharging the solder from the tube.

In the flat plate part 12X described here, the first two ends 12a and 12a are formed in a rectangular flat shape, and the base 12b between the first two ends 12a and 12a is formed in a rectangular flat shape. When this flat plate part 12X is bent into a tubular shape, the base 12b is bent into an arc shape. In other words, the conductor connecting part 12 described here has the arc-shaped base 12b. In the conductor connecting part 12, based on how the first two ends 12a and 12a, the end faces $12a_1$ and $12a_1$ that are the non-plated surfaces of the respective ends 12a and 12a are caused not to be exposed to the outer wall surface 12d side that is the surface of the tubular shape.

Figure 5:
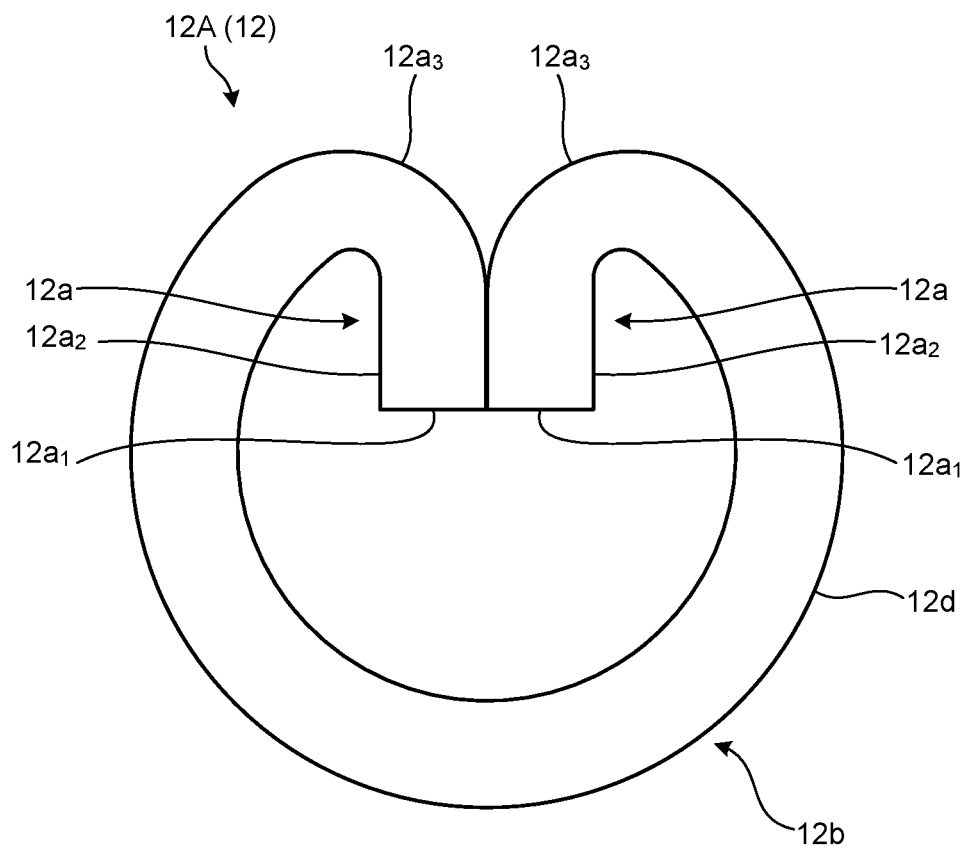
FIG. 5 is a plan view of a conductor connecting part of a first concrete example observed in an axial direction.
Figure 6:
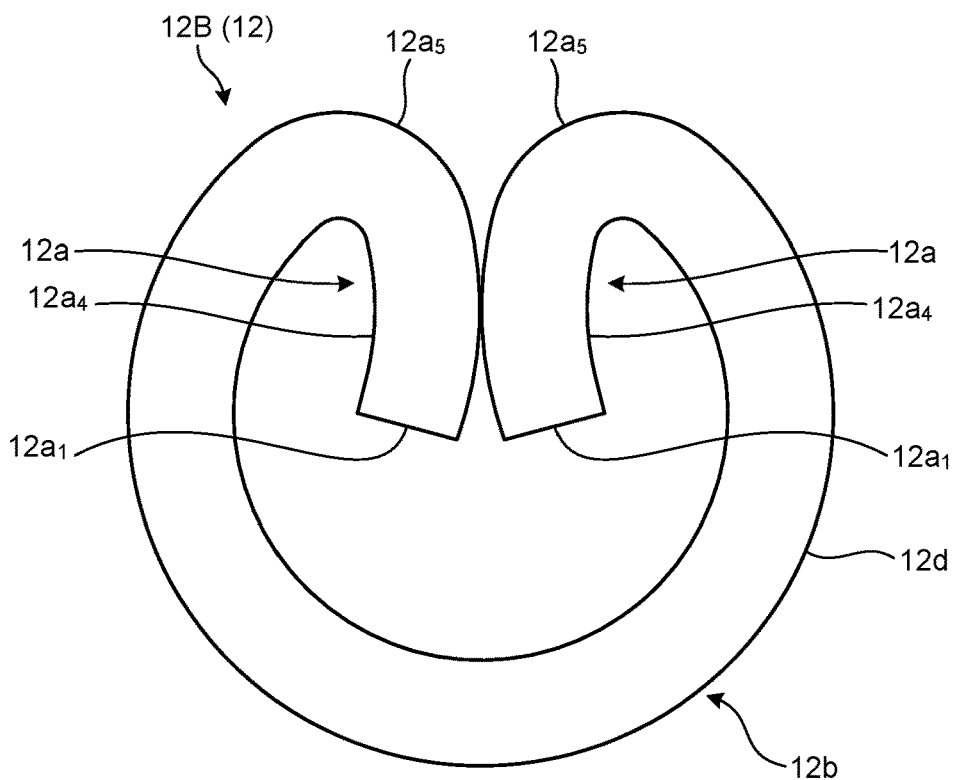
FIG. 6 is a plan view of a conductor connecting part of a second concrete example observed in the axial direction.
Figure 7:
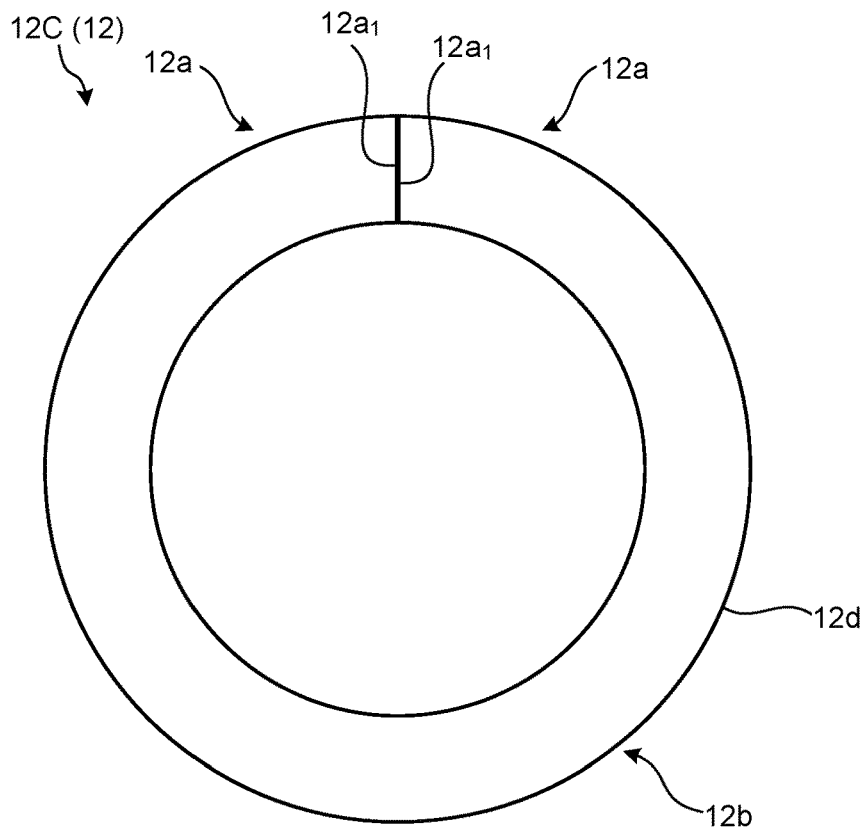
FIG. 7 is a plan view of a conductor connecting part of a third concrete example observed in the axial direction.

FIG. 3 and FIG. 5 illustrate the conductor connecting part 12A as one of concrete examples of the conductor connecting part 12 of the present embodiment. FIG. 6 illustrates a conductor connecting part 12B as another concrete example of the conductor connecting part 12 of the present embodiment. FIG. 7 illustrates a conductor connecting part 12C as yet another concrete example of the conductor connecting part 12 of the present embodiment.

The conductor connecting part 12A of a first concrete example has a tubular shape into which the ends 12a and 12a are folded so that the end faces $12a_1$ and $12a_1$ of the respective ends 12a and 12a are arranged in the tube (FIGS. 3 and 5). Each of the ends 12a and 12a of this conductor connecting part 12A has a flat piece $12a_2$ on the end face $12a_1$ side, and a bend $12a_3$, which is the part that connects this piece $12a_2$ to the arc-shaped base 12b, and is the starting point for folding into the tube. Then, in this conductor connecting part 12A, the pieces $12a_2$ of the respective ends 12a and 12a are caused to come into surface contact with each other. By forming the conductor connecting part 12A of the first concrete example in such a tubular shape, the various effects described above can be obtained.

Similarly to the conductor connecting part 12A of the first concrete example, the conductor connecting part 12B of a second concrete example has a tubular shape into which the ends 12a and 12a are folded so that the end faces $12a_1$ and $12a_1$ of the respective ends 12a and 12a are arranged in the tube (FIG. 6). However, each of the ends 12a and 12a of this conductor connecting part 12B has an arc-shaped piece $12a_4$ on the end face $12a_1$ side and a bend $12a_5$, which is the part that connects this piece $12a_4$ to the arc-shaped base 12b and is the starting point for folding into the tube. The ends 12a and 12a of the conductor connecting part 12B cause the pieces $12a_4$ to be arranged facing each other so that the outer radial wall surfaces thereof oppose to each other, and the outer radial walls of the respective pieces $12a_4$ are caused to come into line contact with each other. By forming the conductor connecting part 12B of the second concrete example in such a tubular shape, the various effects described above can be obtained.

Furthermore, the conductor connecting part 12A of the first concrete example and the conductor connecting part 12B of the second concrete example have the plated surfaces of the respective ends 12a and 12a came into contact with each other, and therefore, if a minute gap has been created therebetween, solder can easily enter the tube through the gap. Therefore, even if a minute gap has been created between the ends 12a and 12a, the fixing strength between the conductor connecting part 12A or the conductor connecting part 12B and the electrical conductor of the conductive component 40 is easily secured, so that the suitable solder part 15 can be formed therebetween. In addition, the conductor connecting part 12A of the first concrete example and the conductor connecting part 12B of the second concrete example have the respective ends 12a and 12a folded into the tube, so that the ends 12a and 12a press against each other when thermally expands, and the change in shape is easily controlled.

The conductor connecting part 12C of a third concrete example has a cylindrical shape with the end faces $12a_1$ and $12a_1$ of the respective ends 12a and 12a butted each other (FIG. 7). In other words, this conductor connecting part 12C is bent into an arc shape so that the ends 12a and 12a and the base 12b have the same diameter. The ends 12a and 12a of this conductor connecting part 12C cause the respective end faces $12a_1$ and $12a_1$ to be butted each other in the contact state. By forming the conductor connecting part 12C of the third concrete example in such a tubular shape, the various effects described above can be obtained.

The terminal fitting 10 described here is molded in a straight shape with the respective tube axes of the terminal part 11 and the conductor connecting part 12 (12A, 12B, 12C) oriented in the same direction. The connector 1 is configured with one or more of the terminal fittings 10. The connector 1 described here includes a plurality of terminal fittings 10.

The housing 20 is molded from an insulating material such as a synthetic resin or the like. The housing 20 has inner housing chambers 20a that accommodate the terminal parts 11 of the terminal fittings 10, and openings 20b (hereinafter referred to as "terminal drawing-out ports") through which the conductor connecting parts 12 of the terminal fittings 10 protrude outward from the housing chambers 20a (FIG. 3). The housing 20 has a smooth terminal drawing-out area 20c provided with the terminal drawing-out ports 20b (FIG. 3). In this housing 20, the terminal parts 11 are housed in the housing chambers 20a through the terminal drawing-out ports 20b, and the conductor connecting parts 12 protrude from the terminal drawing-out ports 20b in the direction opposite to the connector fitting direction to the counterpart connector (i.e., in the connector removing direction).

In the housing 20 described here, a plurality of the housing chambers 20a are provided, and the terminal part 11 is housed in each of the housing chambers 20a. All the housing chambers 20a are formed such that the housing chambers 20a accommodate the respective terminal parts 11 in the same orientation and the respective terminal drawing-out ports 20b are placed on the same plane. In this housing 20, all of the housing chambers 20a are arranged in a grid pattern. Therefore, the housing 20 described here has a rectangular and smooth terminal drawing-out area 20c provided with the terminal drawing-out ports 20b.

In this connector 1, not all the housing chambers 20a have to house the terminal fittings 10, but it is sufficient that a housing chamber 20a in a location needed for the electrical circuitry houses the corresponding terminal fitting 10.

The housing 20 described here has a housing body 21 provided with all the housing chambers 20a (FIGS. 1 to 3). The housing body 21 in this example is formed in a cuboid and has first to sixth outer wall surfaces 21a to 21f (FIGS. 1 to 3).

All the terminal drawing-out ports 20b are arranged on the first outer wall surface 21a. Therefore, the terminal drawing-out area 20c is provided on the first outer wall surface 21a (FIG. 3).

In this housing body 21, the third outer wall surface 21c and the fourth outer wall surface 21d are arranged parallel to each other and are orthogonally connected to the first outer wall surface 21a. In the housing 20, the conductor connecting parts 12 of all the terminal fittings 10 protruding from the terminal drawing-out ports 20b are covered from the third outer wall surface 21c side and the fourth outer wall surface 21d side so as to protect the conductor connecting parts 12. Therefore, the housing 20 has a first protective body 22 that is joined to the third outer wall surface 21c while being arranged facing the third outer wall surface 21c with a gap and that protrudes more than the first outer wall surface 21a does, and a second protective body 23 that is joined to the fourth outer wall surface 21d while being arranged facing the fourth outer wall surface 21d with a gap and that protrudes more than the first outer wall surface 21a does (FIGS. 1 to 3).

The first protective body 22 and the second protective body 23 are arranged on a part in the housing body 21 excluding a fitting-connecting part 21g (FIGS. 1 to 3). The fitting-connecting part 21g is a part that allows fitting connection along the connector inserting direction to the inside of a counterpart fitting-connecting part of a counterpart housing (not illustrated) and allows removal along the connector removing direction from the inside of the counterpart fitting-connecting part of the counterpart housing, and the terminal fittings 10 are housed inside of the fitting-connecting part 21g. This fitting-connecting part 21g is provided on the second outer wall surface 21b side in the housing body 21. Therefore, the first protective body 22 and the second protective body 23 are arranged on the first outer wall surface 21a side in the housing body 21. In the housing 20, the first protective body 22 is arranged at one side end, and the second protective body 23 is arranged at the other side end. Therefore, in the following, the first protective body 22 will be referred to as "first housing sidewall 22" and the second protective body 23 as "second housing sidewall 23" as necessary.

The first protective body 22 in this example has a flat plate part 22a that is a flat rectangle in parallel with and arranged facing the third outer wall surface 21c with a gap (FIGS. 1 to 3). In this first protective body 22, the flat plate part 22a has a protruding part $22a_1$ that protrudes more than the first outer wall surface 21a does, and the protruding part $22a_1$ covers the conductor connecting parts 12 of all the terminal fittings 10 from the third outer wall surface 21c side. In addition, the second protective body 23 in this example has a flat plate part 23a that is a flat rectangle in parallel with and arranged facing the fourth outer wall surface 21d with a gap (FIGS. 1 to 3). In this second protective body 23, the flat plate part 23a has a protruding part $23a_1$ that protrudes more than the first outer wall surface 21a does, and the protruding part $23a_1$ covers the conductor connecting parts 12 of all the terminal fittings 10 from the fourth outer wall surface 21d side.

In this housing body 21, the fifth outer wall surface 21e and the sixth outer wall surface 21f are arranged parallel to each other and each are orthogonally connected to the first outer wall surface 21a, the third outer wall surface 21c, and the fourth outer wall surface 21d. In the connector 1 described here, the conductive component 40 is drawn out toward the sixth outer wall surface 21f side as described later.

In this connector 1, before the cover 30 is assembled to the housing 20, the conductive component 40 is connected to the terminal fittings 10 housed in the housing chambers 20a.

The conductive component 40 is molded as a laminate body including an electrical conductor and an electrical insulator and having through-holes 41. In the conductive component 40, the electrical conductors are physically and electrically connected to the conductor connecting parts 12 inserted into the respective through-holes 41 when the electrical conductors are soldered to the conductor connecting parts 12. This conductive component 40 includes a plurality of electrical conductors. The electrical conductors form a circuit part.

This conductive component 40 is, for example, a component that is molded in a sheet of an electrical conductor and an electrical insulator each having flexibility (or, pliability), and has a flat laminate body of the electrical conductor and the electrical insulator with flexibility. This type of conductive component 40 can be a flexible printed circuit board (what is called FPC), a printed circuit body such as a membrane wiring board, a flat cable (what is called FC), or a flexible flat cable (what is called FFC), or other components. A printed circuit board (what is called PCB), which is more rigid than the above described components, may be used as the conductive component 40. The conductive component 40 described here is a flexible printed circuit board (what is called FPC) and is formed in a rectangle.

The conductive component 40 has a conductor connecting area 40a that physically and electrically connects an electrical conductor to the conductor connecting part 12 of the terminal fitting 10 that protrudes from the terminal drawing-out port 20b, and a conductor drawing-out area 40b that is drawn out in a drawing-out direction from the conductor connecting area 40a to protrude from the housing 20 (FIG. 2 and FIG. 3). In this conductive component 40, the conductor connecting area 40a is housed in the inner space formed by the housing 20 and the cover 30 in the assembly complete state, and the conductor drawing-out area 40b is drawn outward from a drawing-out port formed by the housing 20 and the cover 30 in the assembly complete state. The conductive component 40 described here is divided into the rectangular conductor connecting area 40a and the rectangular conductor drawing-out area 40b. In the following, when "drawing-out direction" is simply written without special mention, it refers to the drawing-out direction of the conductor drawing-out area 40b in the conductive component 40.

The conductor connecting area 40a has through-holes 41 that are through-holes into which the conductor connecting parts 12 are inserted, the through-holes 41 electrically connecting the electrical connecting parts of the electrical conductors on the inner surfaces of the through-holes to the conductor connecting parts 12 (FIG. 3). In the conductor connecting area 40a described here, the circular through-holes 41 are formed for the respective terminal fittings 10 because the conductor connecting parts 12 of all the terminal fittings 10 are to be electrically connected.

Here, the strength of this conductor connecting area 40a is reinforced by a reinforcement plate 50. Therefore, the reinforcement plate 50 is integrated to the conductor connecting area 40a in a stacked state (FIG. 3). The reinforcement plate 50 is molded from an insulating material such as a synthetic resin or the like in a flat plate. The reinforcement plate 50 described here is formed as a flat plate with the same outer shape as the conductor connecting area 40a (i.e., a rectangle with the same shape as the conductor connecting area 40a). This reinforcement plate 50 has a first plane to contact the conductor connecting area 40a, and is integrated in a laminated state to this conductor connecting area 40a by attaching this first plane to the conductor connecting area 40a with an adhesive or the like.

This reinforcement plate 50 is sandwiched between the conductor connecting area 40a and the terminal drawing-out area 20c with the first plane in contact with the conductor connecting area 40a and the second plane in contact with the terminal drawing-out area 20c. Therefore, the reinforcement plate 50 has through-holes 50a (hereinafter referred to as "terminal inserting holes") concentric with the through-holes 41. The through-holes 50a are formed for the respective through-holes 41 (FIG. 3). The terminal inserting holes 50a described here are formed in the same shape as the through-holes 41.

In this connector 1, with the terminal fittings 10, the housing 20, the conductive component 40, and the reinforcement plate 50 in the arranged state, soldering is performed for each combination of the paired conductor connecting part 12 and through-hole 41 to fix the conductor connecting part 12 and through-hole 41 each other. Then in the connector 1, the cover 30 is assembled to the housing 20.

The cover 30 is molded from an insulating material such as a synthetic resin or the like. This cover 30 is assembled to the housing 20 to cover the housing 20 from the outside. Specifically, this cover 30 is formed to cover a protruding portion from the counterpart fitting-connecting part in the housing 20 from the outside when the fitting-connecting part 21g and the counterpart fitting-connecting part are in a fitting-connecting complete state. In other words, the cover 30 is formed to cover the rest of the housing 20 from the outside with the fitting-connecting part 21g protruding from the inner space in the cover. Therefore, this cover 30 covers the terminal drawing-out area 20c (i.e., the conductor connecting parts 12 of all the terminal fittings 10 that protrude from the terminal drawing-out ports 20b).

This cover 30 has a cover main wall 31 that forms a main body for covering the aforementioned protruding portion (the protruding portion from the counterpart fitting-connecting part in the housing 20 when the fitting-connecting part 21g and the counterpart fitting-connecting part are in the fitting-connecting complete state) (FIGS. 1 and 2). The cover main wall 31 described here has a first wall body 31A and a second wall body 31B connected in a crossed state (FIG. 2). In this cover 30, the first wall body 31A is arranged facing the first outer wall surface 21a with a gap and the second wall body 31B is arranged facing the first outer wall surface 21a side of the fifth outer wall surface 21e with a gap.

Furthermore, this cover 30 has a first cover sidewall 32 and a second cover sidewall 33, which are arranged facing each other with a gap, orthogonally connected to both ends of the cover main wall 31, and have flexibility (FIGS. 1 and 2). The first cover sidewall 32 and the second cover sidewall 33 are arranged facing each other with a gap in the direction (hereinafter referred to as "width direction") orthogonal to both the connector inserting direction (or the connector removing direction), and the drawing-out direction of the conductive component 40. The first cover sidewalls 32 and the second cover sidewall 33 are orthogonally connected to both respective ends of the cover main wall 31 in the width direction (both ends of the first wall body 31A and the second wall body 31B).

When this cover 30 with the housing 20 is in the assembly complete state, the flat first cover sidewall 32 is in parallel with and arranged facing the flat plate part 22a of the first housing sidewall 22 from the outside, and the flat second cover sidewall 33 is in parallel with and arranged facing the flat plate part 23a of the second housing sidewall 23 from the outside. The first cover sidewall 32 is formed to deflect and deform at least in the direction away from the first housing sidewall 22. The second cover sidewall 33 is formed to deflect and deform at least in the direction away from the second housing sidewall 23.

The cover 30 has: a first opening 30a (FIGS. 1 and 2) having a periphery defined with the respective ends of the cover main wall 31, the first cover sidewall 32, and the second cover sidewall 33 in the connector inserting direction; and a second opening 30b (FIG. 2) having a periphery defined with the respective ends of the cover main wall 31, the first cover sidewall 32, and the second cover sidewall 33 in the drawing-out direction of the conductive component 40 {that is, in the direction orthogonal to the direction (width direction) along which the first cover sidewall 32 and the second cover sidewall 33 are arranged facing each other, and orthogonal to the connector inserting direction (or connector removing direction)}, and is partially used as the drawing-out port for the conductive component 40. The first opening 30a described here is formed as an opening that is arranged facing the first wall body 31A with a gap in the connector inserting direction and has the periphery defined with the respective edges of the second wall body 31B, the first cover sidewall 32, and the second cover sidewall 33. The second opening 30b described here is formed as an opening that is arranged facing the second wall body 31B with a gap and has the periphery defined with the respective edges of the first wall body 31A, the first cover sidewall 32, and the second cover sidewall 33. In this cover 30, the first opening 30a and the second opening 30b are orthogonally connected to each other. Therefore, the first cover sidewall 32 and the second cover sidewall 33 each have the greatest amount of flexural deformation at the intersection where the first opening 30a side and the second opening 30b side intersect.

In this connector 1, a space is formed between the first outer wall surface 21a of the housing body 21, the protruding part 22a₁ of the first protective body 22, the protruding part 23a₁ of the second protective body 23, and the first wall body 31A and second wall body 31B of the cover 30, and the conductor connecting parts 12 of all terminal fittings 10 are placed in the space. In this connector 1, the space communicates with the outside through a part of the second opening 30b. The part of the second opening 30b is the gap formed between the housing 20 and the first wall body 31A. Therefore, in this connector 1, the gap becomes the drawing-out port that allows the conductive component 40 to be drawn outward from the sixth outer wall surface 21f side.

The cover 30 is inserted and connected to the housing 20 from the first outer wall surface 21a side along the connector fitting direction. Guide structures 60 are provided between the housing 20 and the cover 30 along the connecting direction therebetween to guide each other to an assembly complete position (FIG. 1). The guide structures 60 each include: a guide protrusion 61 that is provided to one of the housing 20 and the cover 30, has a wedge-shaped cross section orthogonal to the connecting direction, and extends along the connecting direction; and a guide groove 62 that is provided to the other of the housing 20 and the cover 30 and extends along the connecting direction to allow the guide groove 62 and the inserted guide protrusion 61 to guide each other along the connecting direction. The guide protrusion 61 and the guide groove 62 each have at least two planes parallel to each other or intersecting each other along the connection direction of the housing 20 and the cover 30.

In the connector 1 described here, these guide structures 60 are provided in two locations. The two guide structures 60 are provided in such a way that the direction of protrusion of one guide protrusion 61 is opposite to the direction of protrusion of the other guide protrusion 61. The guide protrusions 61 described here are provided on the first cover sidewall 32 and the second cover sidewall 33 of the cover 30. Here, the guide protrusions 61 are formed on the respective edges of the rectangular flat first cover sidewall 32 and the rectangular flat second cover sidewall 33 on the second opening 30b side. In the cover 30, the guide protrusions 61 protrude inward and the guide protrusions 61 are arranged facing each other. The guide grooves 62 described here are provided to the first housing sidewall 22 and the second housing sidewall 23 of the housing 20. The guide groove 62 of the first housing sidewall 22 is arranged adjacent to the flat plate part 22a on the sixth outer wall surface 21f side. The guide groove 62 of the second housing sidewall 23 is arranged adjacent to the flat plate part 23a on the sixth outer wall surface 21f side.

In this connector 1, the fitting-connecting part 21g of the housing body 21 is fit and connected to the counterpart fitting-connecting part of the counterpart housing as described above. Here, the counterpart fitting-connecting part is formed in the shape of a square tube, and the fitting-connecting part 21g is inserted and fit into the inner part of the counterpart fitting-connecting part. A retaining structure 70 is provided between the housing 20 and the counterpart housing to retain the fitting-connecting complete state (FIGS. 1 to 3). The housing 20 has, as components of the retaining structure 70, an engaging body 71 that engages with an counterpart engaging body of the counterpart fitting-connecting part (not illustrated) in the opposite direction of the fitting-connecting direction when the fitting-connecting part 21g and the counterpart fitting-connecting part are in the fitting-connecting complete state and retains the fitting-connecting part 21g and the counterpart fitting-connecting part in the fitting-connecting complete state, and a disengaging arm 72 that bends with the disengagement force applied to a point-of-effort part 72a to release an engageable state between the engaging body 71 and the counterpart engaging body.

The engaging body 71 and the disengaging arm 72 are arranged on the opposite side of the second opening 30b in the housing 20 (i.e., the fifth outer wall surface 21e side of the housing 20) when the housing 20 and the cover 30 are in the assembly complete state. The disengaging arm 72 is formed to receive a pushing operation toward the second opening 30b side (i.e., toward the fifth outer wall surface 21e) when releasing the engageable state between the engaging body 71 and the counterpart engaging body. The disengaging arm 72 has the point-of-effort part 72a as a place for an operator to perform the pushing operation.

Here, the engaging body 71 is formed as an engaging protrusion, and the counterpart engaging body is formed as a through-hole that engages the engaging body 71 after the engaging body 71 is inserted thereinto. The engaging body 71 described here is engaged with the peripheral wall of the counterpart engaging body that is the through-hole for the engaging body 71. The disengaging arm 72 described here has a cantilevered shape that can be elastically deformed with a fixed end as a fulcrum. Here, the fixed end is provided on the fitting-connecting part 21g side of the fifth outer wall surface 21e, and the free end is provided on the first outer wall surface 21a side (excluding the fitting-connecting part 21g) of the fifth outer wall surface 21e. In this disengaging arm 72, the free end of the arm is the point-of-effort part 72a. Here, the point-of-effort part 72a is formed in the shape of a rectangular flat plate. The disengaging arm 72 has wall surfaces arranged facing each other with a gap on the fitting-connecting part 21g side of the fifth outer wall surface 21e of the housing body 21. In this disengaging arm 72, the engaging body 71 is provided to another wall surface on the opposite side of the aforementioned wall surfaces and between the fixed end and the free end in a protruding state. In the disengaging arm 72 formed in this way, the disengaging force toward the fifth outer wall surface 21e is applied to the point-of-effort part 72a in order to release the engageable state between the engaging body 71 and the counterpart engaging body. In this retaining structure 70, the disengaging force bends the disengaging arm 72, and the engaging body 71 is displaced to the fifth outer wall surface 21e side in conjunction with the bend of the disengaging arm 72, so that the engageable state between the engaging body 71 and the counterpart engaging body is released.

In the cover 30, the second wall body 31B is arranged facing the first outer wall surface 21a side of the fifth outer wall surface 21e with a gap as described above, and therefore, not only the first outer wall surface 21a side of the fifth outer wall surface 21e but also the free end of the disengaging arm 72 (i.e., the point-of-effort part 72a) are covered with the second wall body 31B. Therefore, the second wall body 31B is provided with a pushing part 34 that covers the point-of-effort part 72a and pushes the point-of-effort part 72a toward the fifth outer wall surface 21e by displacing itself toward the second opening 30b (fifth outer wall surface 21e side) (FIGS. 1 and 2). The pushing part 34 is formed in a cantilevered shape with flexibility. The pushing part 34 described here is formed in the shape of a chip body with a fixed end on the first wall body 31A side and a free end on the first opening 30a side. Upon being pushed and moved toward the fifth outer wall surface 21e, the pushing part 34 pushes and moves the point-of-effort part 72a in the contact state to the fifth outer wall surface 21e, so that the engageable state between the engaging body 71 and the counterpart engaging body is released.

As described above, the terminal fitting 10 of the present embodiment has the conductor connecting part 12 formed in the aforementioned tubular shape, and can therefore make the entire outer wall surface 12d the plating layer without exposing the end faces $12a_1$ and $12a_1$ as the non-plated surfaces of the respective ends 12a and 12a to the surface. Therefore, this terminal fitting 10 can deter the generation of solder balls (solder spatter) and improve the wettability of solder, so that the suitable solder part 15 can be formed between the conductor connecting part 12 and the electrical conductor of the conductive component 40.

Furthermore, since the terminal fitting 10 of the present embodiment can deter the generation of solder balls, it can avoid insufficient insulation distance between the terminal fitting 10 and another nearby terminal fitting 10 or conductive member, and if laser soldering is to be used, it can increase the degree of freedom in the direction of solder supply.

Furthermore, in the terminal fitting 10 of the present embodiment, the ends 12a and 12a are butted each other in the contact state, so that the change in shape when thermal expansion or contraction due to thermal shock occurs on the conductor connecting part 12 can be restricted to a small degree. Accordingly, the occurrence of cracks in the solder part 15 can be suppressed.

Furthermore, even if the terminal fitting 10 of the present embodiment has a minute gap between the ends 12a and 12a of the conductor connecting part 12, the solder that enters the tube through the gap can secure the fixing strength between the conductor connecting part 12 and the electrical conductor of the conductive component 40, so that the suitable solder part 15 can be formed therebetween. In addition, the terminal fitting 10 of the present embodiment can minimize the amount of solder supplied by storing the solder in this tube in the conductor connecting part 12 without discharging the solder from the tube.

The connector 1 of the present embodiment includes the terminal fitting 10 as described above and can exhibit the same effect as that obtained by the terminal fittings 10. Furthermore, this connector 1 has the conductor drawing-out area 40b of the conductive component 40 drawn outward, so that when force is applied to this conductor drawing-out area 40b, the force is transmitted to the solder part 15. However, in this connector 1, the fixing strength between the conductor connecting part 12 and the electrical conductor of the conductive component 40 has been made strong by the suitable solder part 15 obtained by including the terminal fittings 10, so that even if force is applied to the conductor drawing-out area 40b, the occurrence of cracks in the solder part 15 can be prevented.

By the way, the conductor connecting part 12 undergoes thermal expansion or contraction in response to temperature changes, and depending on the amount of change in temperature, the end faces $12a_1$ and $12a_1$ of the respective ends 12a and 12a may come into contact with each other. And in this conductor connecting part 12, if thermal expansion or contraction continues after the contact, thermal stress will be generated along with the thermal expansion or contraction. In other words, in the conductor connecting part 12, thermal stress may be generated as the positions of the end faces $12a_1$ and $12a_1$ of the respective ends 12a and 12a change in response to temperature change.

For example, in the conductor connecting part 12, the temperature rises when the conductor connecting part 12 is being soldered to the electrical conductor of the conductive component 40, and the thermal expansion during the soldering process causes the end faces $12a_1$ and $12a_1$ of the respective ends 12a and 12a to come into contact with each other, generating thermal stress while exerting force on each other between the end faces $12a_1$ and $12a_1$. In this case, if there is no place for the force to escape in the conductor connecting part 12, for example, the ends 12a and 12a may overlap in the radial direction, and the positions of the end faces $12a_1$ and $12a_1$ that are the non-plated surfaces may change significantly, so that one of the end faces $12a_1$ may be exposed to the surface.

Therefore, in the terminal fittings 10 of the present embodiment, the conductor connecting part 12 (conductor connecting part 12A, 12B, 12C described above) is formed as the one (conductor connecting part 12D) provided with a relief part 14 described later (FIG. 9 to FIG. 11), so that the exposure of the end faces $12a_1$ of the ends 12a to the surface is suppressed. The relief part 14 is to release the thermal stress caused by the change in the positions of the end faces $12a_1$ and $12a_1$ of the respective ends 12a and 12a in response to the temperature change of the conductor connecting part 12D.

In the conductor connecting part 12D, the end faces $12a_1$ and $12a_1$ of the respective ends 12a and 12a come into contact with each other by the change in positions of the end faces $12a_1$ and $12a_1$ due to thermal expansion or contraction in response to temperature changes. In this conductor connecting part 12D, if thermal expansion or contraction continues, thermal stress will be generated as described above, but by releasing the thermal stress to the relief part 14, further changes in the positions of the end faces $12a_1$ and $12a_1$ of the respective ends 12a and 12a can be suppressed. Therefore, from this point of view, the terminal fitting 10 of the present embodiment can make the entire outer wall surface 12d the plating layer without exposing the end faces $12a_1$ and $12a_1$ as the non-plated surfaces of the respective ends 12a and 12a to the surface when, for example, the conductor connecting part 12 and the electrical conductor of the conductive component 40 are being soldered. Therefore, this terminal fitting 10 can further deter the generation of solder balls (solder spatter) and further improve solder wettability, so that the suitable solder part 15 can be formed between the conductor connecting part 12 and the electrical conductor of the conductive component 40.

Figure 10:
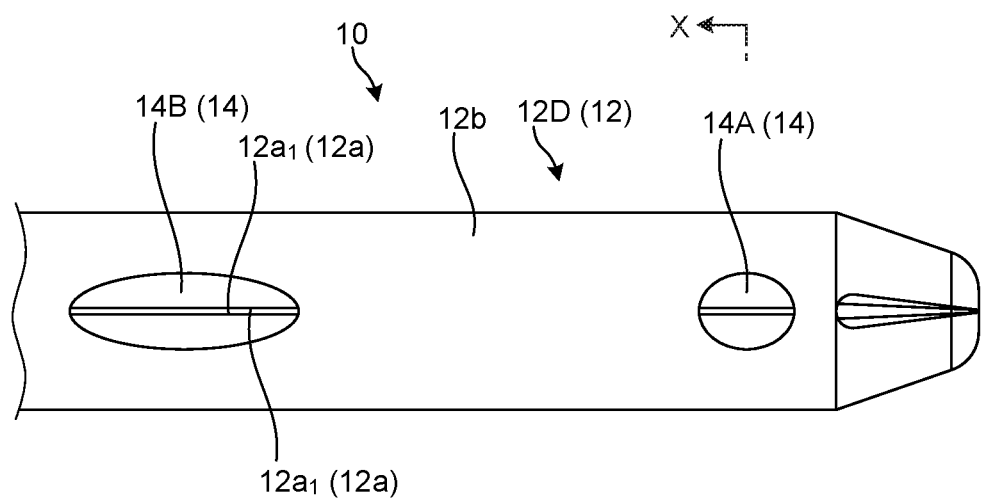
FIG. 10 is a plan view of the conductor connecting part of the modified embodiment observed in a direction orthogonal to the axial direction.
Figure 11:
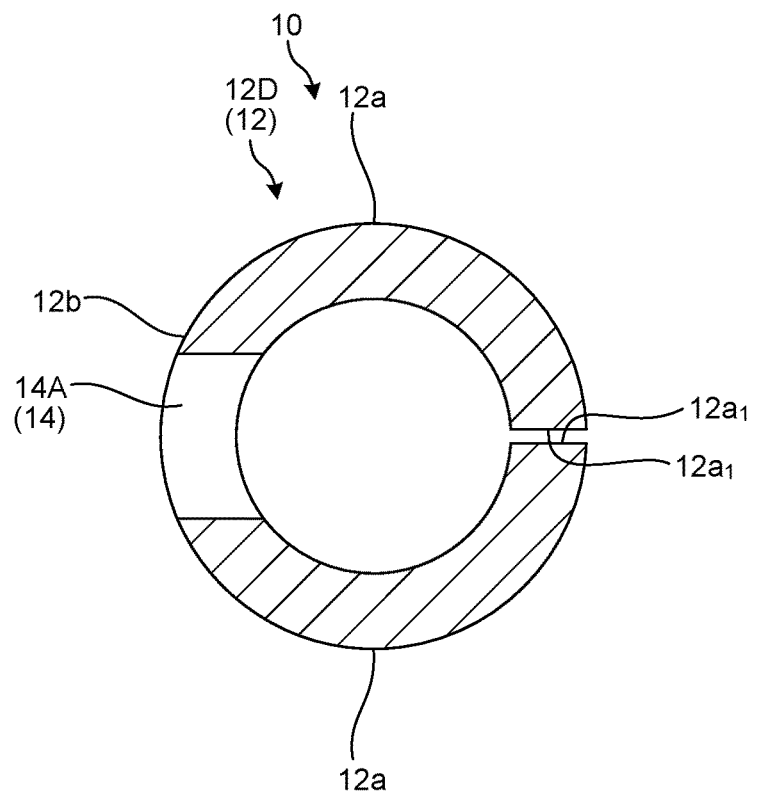
FIG. 11 is a sectional view taken along line X-X of FIG. 10.

Specifically, the relief part 14 is, for example, a through-hole in a part of the conductor connecting part 12D or a recessed part of the conductor connecting part 12D. In the conductor connecting part 12D, at least one relief part 14 is provided on the opposite side of the end faces $12a_1$ and $12a_1$ of the respective ends 12a and 12a with respect to the tube axis. In other words, this relief part 14 is provided at the base 12b of the conductor connecting part 12D. The relief parts 14 described here are two through-holes arranged with a gap therebetween in the tube axis direction (FIG. 10). The relief parts 14 described here is each formed in an ellipse or other ellipse-shaped through-hole, where the tube axis direction is the longitudinal direction (FIG. 10).

Here, all of the relief parts 14 may be formed in the same shape, or in at least two different shapes. For example, it can be said that, in the terminal fitting 10, the conductor connecting part 12D has a cantilevered shape with a fixed end on the coupling part 13 side. Therefore, in the conductor connecting part 12D, if the relief parts 14 of the same shape are provided on the fixed end side and the free end side, respectively, thermal stress may be more difficult to escape from the relief part 14 (relief part 14B) on the fixed end side than the relief part 14 (relief part 14A) on the free end side. Therefore, here, the relief part 14B at the fixed end is formed as a larger through-hole than the relief part 14A at the free end (FIG. 10), so that, for example, thermal stress is released equally from both relief parts 14A and 14B.

Figure 12:
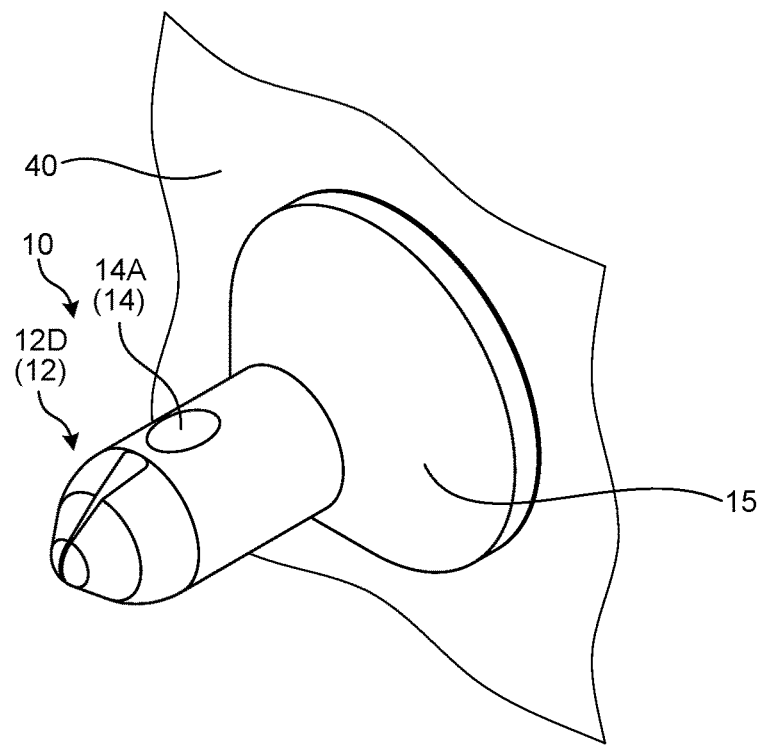
FIG. 12 is a perspective view illustrating positional relationship between a relief part and a solder part.
Figure 13:
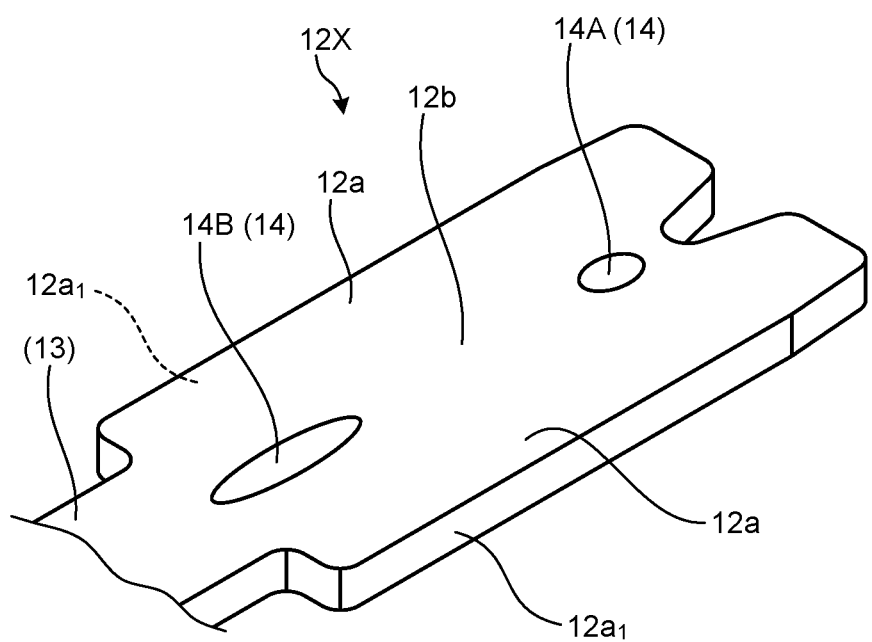
FIG. 13 is a perspective view illustrating an unfolded shape of the conductor connecting part of the modified embodiment before a bending process.

The relief parts 14 should be located away from where the solder part 15 is formed (FIG. 12). In FIG. 12, only the positional relationship between the relief part 14A on the free end side and the solder part 15 is illustrated, but in this conductor connecting part 12D, the relief part 14B on the fixed end side is also provided in a place excluding the place where the solder part 15 is formed. For example, when the terminal fitting 10 is produced by press molding from the base material (metal plate) each plane of which has been plated beforehand, the relief parts 14 described here as through-holes are formed by being punched out together with the terminal fitting 10 from the metal plate (FIG. 13). Therefore, in the relief parts 14, the inner surfaces of the peripheries are the same non-plated surfaces as the end faces $12a_1$ and $12a_1$ of the respective ends 12a and 12a. Therefore, in the conductor connecting part 12D, by providing the relief parts 14 in places excluding the place where the solder part 15 is formed, soldering can be performed without considering the wettability of solder on the non-plated surfaces on the peripheries of the relief parts 14.

As for the relief part 14B on the fixed end side, the non-plated surface on the periphery of the relief part 14B can repel the solder before it solidifies into the solder part 15 during soldering, thus preventing the solder from flowing out to the terminal part 11 through the coupling part 13.

In this section, the case where the terminal fittings 10 are applied to the connector 1 has been explained. However, the terminal fittings 10 can also be applied to an electrical junction box, such as a junction box, for example, to obtain the same effects as those described above. In that electrical junction box, the terminal fittings 10 and the conductive component 40 are housed in an enclosure, and the terminal fittings 10 and the conductive component 40 are soldered together in the enclosure as in the aforementioned example of the connector 1.

The terminal fitting according to the present embodiment has the conductor connecting part 12 formed in a tubular shape as described above, and can therefore allow the entire outer wall surface to be a plating layer without exposing the end faces as the non-plated surfaces of the respective ends to the surface. Accordingly, this terminal fitting can deter the generation of solder balls (solder spatter) and improve the wettability of solder, and can thereby allow a suitable solder part to be formed between the conductor connecting part and the electrical conductor of the conductive component. Furthermore, the terminal fitting can deter the generation of solder balls, and can therefore prevent the shortage of insulation distance between the terminal fitting and another nearby terminal fitting or a conductive member. In addition, if laser soldering is to be performed, the terminal fitting can increase the flexibility of the direction of solder supply during the laser soldering process. The connector according to the present invention includes such a terminal fitting and can exhibit the same effect as that obtained by the terminal fitting.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A connector comprising:
    a terminal fitting having a terminal part and a conductor connecting part;
    a housing in which the terminal fitting is housed; and
    a conductive component that is molded as a laminate body including an electrical conductor and an electrical insulator and having a through-hole, and causes the electrical conductor to be physically and electrically connected to the conductor connecting part inserted into the through-hole when the electrical conductor is soldered to the conductor connecting part, wherein
    the conductor connecting part is formed in a tubular part with two ends butted each other in a contact state so that end faces that are non-plated surfaces of the ends do not appear on a surface, and an entire outer wall surface of the tubular part is a plating layer.

2. The connector according to claim 1, wherein
    the conductor connecting part has a tubular shape into which the ends are folded so that the end faces of the respective ends are arranged in the tube.

3. The connector according to claim 2, further comprising:
    a solder part in which the conductor connecting part is laser-soldered to the electrical conductor.

4. The connector according to claim 3, wherein
    the conductor connecting part has a relief part that release thermal stresses caused by change in a position of the end face of each end in response to temperature changes.

5. The connector according to claim 2, wherein
    the conductor connecting part has a relief part that release thermal stresses caused by change in a position of the end face of each end in response to temperature changes.

6. The connector according to claim 1, wherein
    the conductor connecting part has a cylindrical shape with the end faces of the respective ends butted each other.

7. The connector according to claim 6, further comprising:
    a solder part in which the conductor connecting part is laser-soldered to the electrical conductor.

8. The connector according to claim 7, wherein
    the conductor connecting part has a relief part that release thermal stresses caused by change in a position of the end face of each end in response to temperature changes.

9. The connector according to claim 6, wherein
    the conductor connecting part has a relief part that release thermal stresses caused by change in a position of the end face of each end in response to temperature changes.

10. The connector according to claim 1, further comprising:
    a solder part in which the conductor connecting part is laser-soldered to the electrical conductor.

11. The connector according to claim 10, wherein
    the conductor connecting part has a relief part that release thermal stresses caused by change in a position of the end face of each end in response to temperature changes.

12. The connector according to claim 1, wherein
    the conductor connecting part has a relief part that release thermal stresses caused by change in a position of the end face of each end in response to temperature changes.

13. The connector according to claim 1,
    wherein a plating of the entire outer wall surface is ended at the non-plated surfaces,
    wherein the tubular part is round, and
    wherein the end faces face a same direction.

14. The connector according to claim 13, wherein the end faces face an inside of the tubular part.

15. The connector according to claim 14, wherein the end faces are in direct contact with each other.

16. A terminal fitting comprising:
    a terminal part;
    a conductor connecting part that is inserted into a through-hole of a conductive component molded as a laminate body including an electrical conductor and an electrical insulator and is physically and electrically connected the electrical conductor when the electrical conductor is soldered to the conductor connecting part, wherein
    the conductor connecting part is formed in a tubular part with two ends butted each other in a contact state so that end faces that are non-plated surfaces of the ends do not appear on a surface, and an entire outer wall surface of the tubular part is a plating layer.

* * * * *